United States Patent [19]

Kruse, Jr.

[11] Patent Number: 5,293,041
[45] Date of Patent: Mar. 8, 1994

[54] THIN FILM PYROELECTRIC IMAGING ARRAY

[75] Inventor: Paul W. Kruse, Jr., Edina, Minn.

[73] Assignee: Honeywell Inc., Minneapolis, Minn.

[21] Appl. No.: 63,182

[22] Filed: May 12, 1993

Related U.S. Application Data

[63] Continuation of Ser. No. 787,169, Nov. 4, 1991, abandoned.

[51] Int. Cl.$^5$ .................................. G01J 5/06
[52] U.S. Cl. ................... 250/338.3; 250/332
[58] Field of Search ............... 250/338.3, 332

[56] References Cited

U.S. PATENT DOCUMENTS

| | | | |
|---|---|---|---|
| 4,115,692 | 9/1978 | Balcerak et al. | 250/338.3 |
| 4,691,104 | 9/1987 | Murata et al. | 250/338.3 |
| 5,021,660 | 6/1991 | Tomita et al. | 250/338.3 |

FOREIGN PATENT DOCUMENTS

| | | | |
|---|---|---|---|
| 354369 | 2/1990 | European Pat. Off. | |
| 119426 | 6/1985 | Japan | 250/338.3 |
| 1170626 | 8/1986 | Japan | 250/338.3 |
| 1195318 | 8/1986 | Japan | 250/338.3 |
| 136035 | 5/1989 | Japan | 250/338.3 |
| 41305 | 2/1991 | Japan | 250/338.3 |
| 9116607 | 10/1991 | PCT Int'l Appl. | 250/338.4 |

OTHER PUBLICATIONS

Infrared Phys. vol. 33, No. 4, pp. 229-236, 1992, "Infrared Linear Image Sensor using a Poly-Si pn Junction Diode Array", A. Tanaka, et al.

IEEE Transactions on Electron Devices, vol. ED-25, No. 10, Oct. 1978, "Fabrication of Novel Three-Dimensional Microstructures by the Anisotropic Etching of (100) and (110) Silicon", Ernest Bassous.

IEEE Transactions on Electron Devices, vol. ED-25, No. 10, Oct. 1978, "Dynamic Micromechanics on Silicon: Techniques and Devices", Kurt E. Peterson.

International Journal of Infrared and Millimeter Waves, vol. 6, No. 1, 1985, "Si-Monolithic Integrated Pyroelectric Infrared Sensor Made of PbTiO$_3$ Thin Films", M. Okuyama, et al.

Japanese Journal of Applied Physics, vol. 22 (1983) Supplement 22-1, pp. 465–468, "Integrated Pyroelectric Infrared Sensor Using PbTiO$_3$Thin Film", M. Okuyama, et al.

Suzuki et al, "An Infrared Detector Using Poly-Silicon p-n Junction Diode", Tech. Digest of 9th Sensor Sym., 1990, pp. 71-74.

*Primary Examiner*—Carolyn E. Fields
*Attorney, Agent, or Firm*—Michael B. Atlass

[57] ABSTRACT

A thin film pyroelectric imaging array fabricated as a Si wafer. A thin film of PbTiO$_3$ is deposited on a thermally isolated bridge. The bridge suspends the PbTiO$_3$ sensor over a preferentially etched cavity in the Si wafer. Improved thermal isolation increases the responsivity of the sensor to incident radiation. The pyroelectric sensor formed can operate effectively at room temperature.

11 Claims, 10 Drawing Sheets

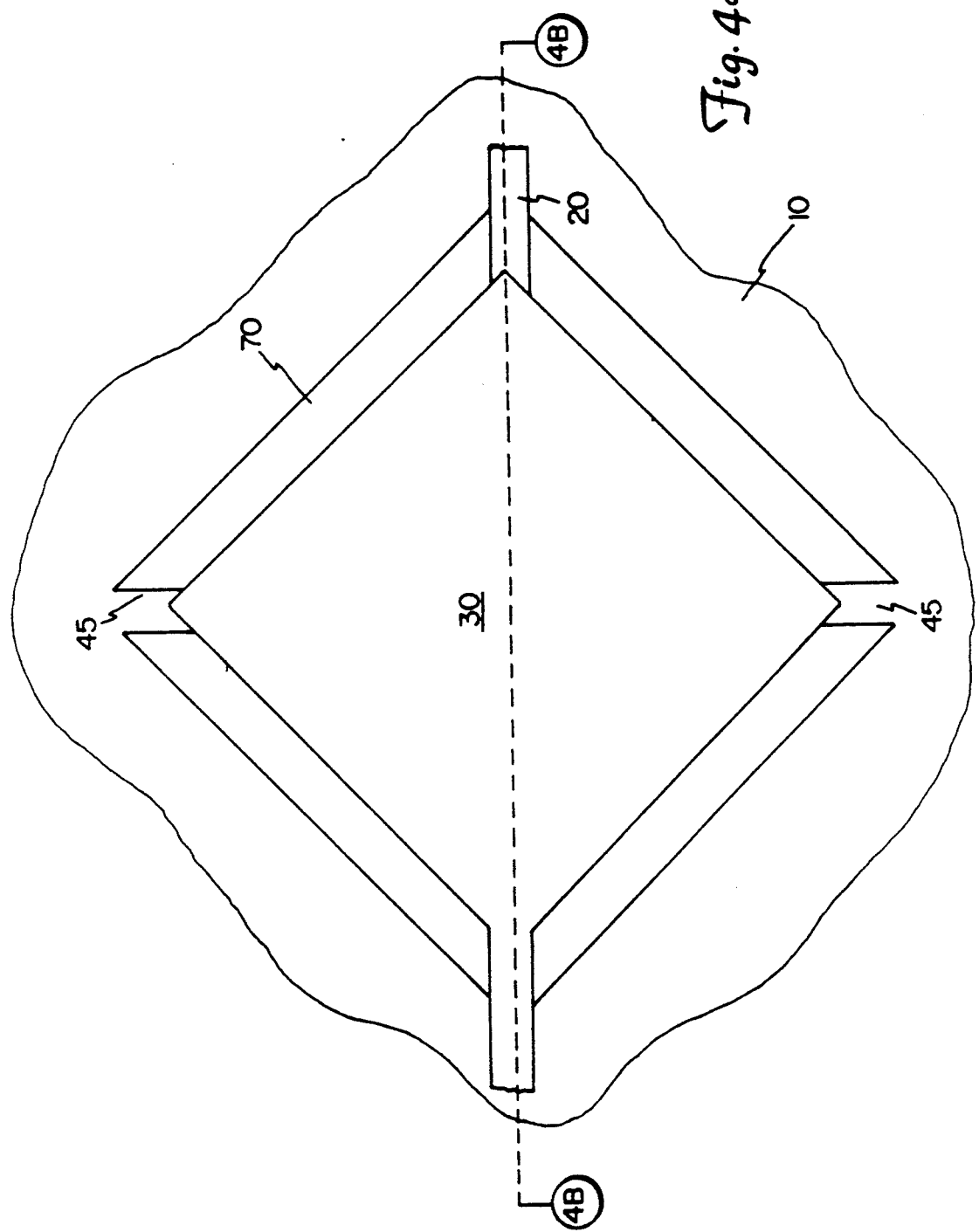

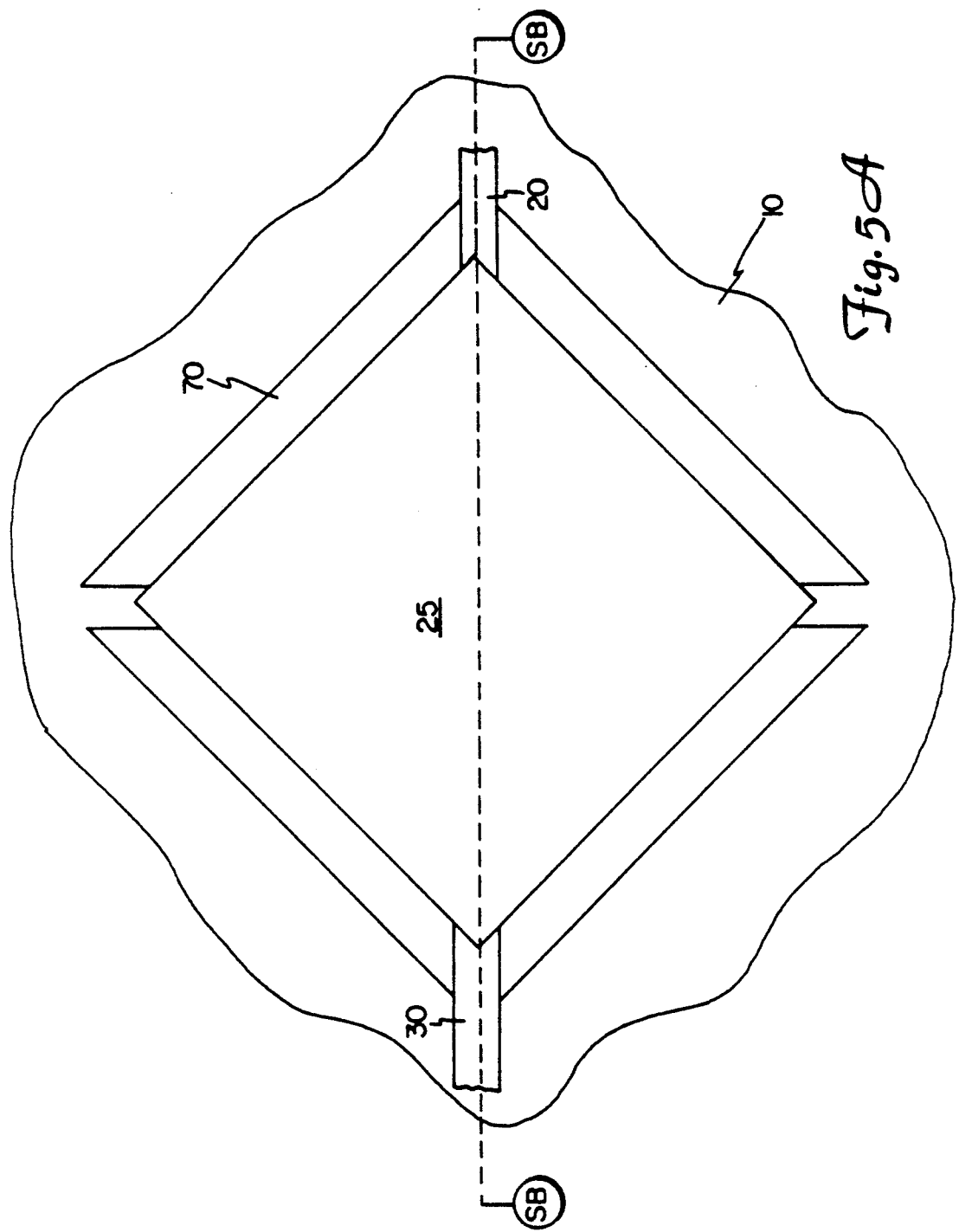

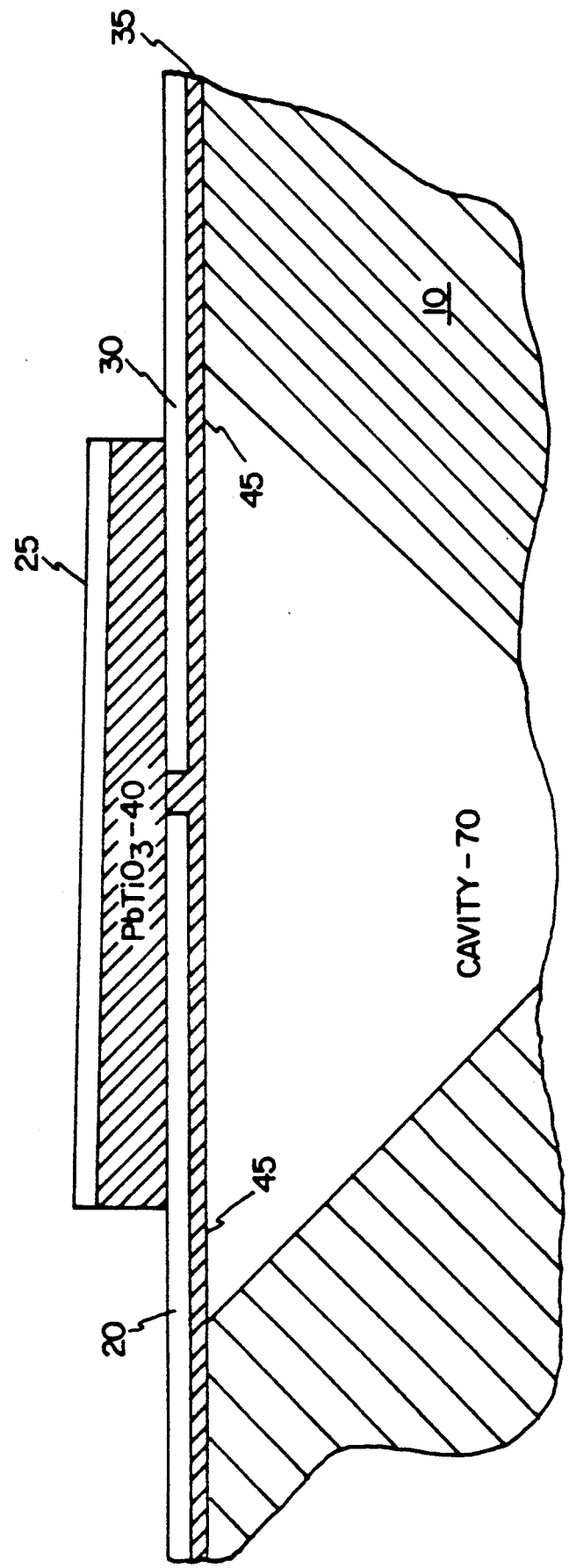

THIN FILM PYROELECTRIC IMAGING ARRAY

This application is a continuation of application Ser. No. 07/787,169, filed Nov. 4, 1991, now abandoned.

This invention relates to a thin film pyroelectric imaging array and, more particularly, to a thin film pyroelectric imaging array constructed from coplanar electrodes on a silicon substrate utilizing a platinum electrode suspended by four bridge supports over an evacuated silicon cavity.

BACKGROUND OF THE INVENTION

Integrated pyroelectric infrared sensors using $PbTiO_3$ thin films are well-known in the art. Prior art radiation sensing arrays have been constructed to sense infrared radiation using a $PbTiO_3$ thin film on a Pt-coated mica, silicon crystal or silicon membrane where the thin film was deposited by RF sputtering. Some prior art methods have employed a linear array sensor having up to 16 elements. Operating parameters of these devices have been characterized and are well known.

$PbTiO_3$ has been of interest due to its ability to operate at room temperature. Room temperature operational infrared sensors can be used for such applications as remote sensing, biomedical tomography and gas detection. Pyroelectric infrared sensors enjoy some unique advantages over other sensors such as photon sensors. Photon sensors operating in the mid to far infrared region suffer from very low operating temperature requirements which do not provide the advantage of pyroelectric detectors which can be operated at room temperature and operate well throughout the infrared region. Pyroelectric detectors have small wavelength dependence over a wide infrared range and enjoy a fast response time. $PbTiO_3$ shows excellent pyroelectric characteristics because of its large pyroelectric coefficient and high Curie temperature.

Prior art pyroelectric detectors have been constructed from materials such as $PbTiO_3$ ceramics and $LiTaO_3$ single crystals. The prior art employed thin film construction techniques to manufacture planar devices. FIG. 1A shows a $PbTiO_3$ thin film device constructed with RF sputtering. The device has been fabricated as an infrared sensitive linear array which has a structure of $PbTiO_3$ thin film on a silicon substrate.

The structures in FIG. 1A have been constructed of a thin film of $PbTiO_3$ 110, a silicon membrane 160, a silicon dioxide layer 150 and an aluminum conductor or Au-black conductor 120. Substrates were created also from a mica sheet 140 with a thickness of 20–50 microns or a silicon single crystal 140. To thin out the silicon membrane, the silicon was preferentially etched into a rectangular thin layer of about 5–20 microns thickness. Platinum/titanium electrodes 130 with 16 elements were formed on a substrate. The $PbTiO_3$ 110 thin film has a thickness of about 2.1 microns which is deposited by RF sputtering. An aluminum or Au-black layer 120 is formed as an infrared absorbing electrode. The array sensor was electrically poled before measuring the infrared response by applying a high electric field to the $PbTiO_3$ 110 thin film at high temperature. This $PbTiO_3$ pyroelectric infrared sensor is described in more detail in a publication of the faculty of Engineering Science, Osaka University, Japan, entitled "Integrated Pyroelectric Infrared Sensor Using $PbTiO_3$ Thin Film", Masanori Okuyama, Hiroyuki Seto, Motohiro Kojima, Yasushi Matsui and Yoshihiro Hamakawa, Proceedings of the 14th Conference (1982 International) on Solid State Devices, Tokyo, 1982; Japanese *Journal of Applied Physics*, Volume 22 (1983) Supplement 22-1, pp. 465–468.

FIG. 2 shows an equivalent circuit 200 of the array sensor of Okuyama, et al. The photodetection element of the array is modeled as a connection of a current source in parallel with a capacitor 210. A pyroelectric current induced under illumination fills the capacitor 210 with charge proportional to the integral of current over time. The charge is then switched through a connecting FET 220 by applying a gate pulse with a sample interval. The circuit 200 is then connected to a current amplifier for sampling. Current sampling effectively resets the sensor which is required by each sampling period.

An alternate integrated pyroelectric infrared sensor is described in an article from the faculty of Engineering Science at Osaka University, Japan, dated Dec. 17, 1984, found in the *International Journal of Infrared and Millimeter Waves*, Volume 6, No. 1, 1985 entitled "Si Monolithic Integrated Pyroelectric Infrared Sensor Made of $PbTiO_3$ Thin Film" by Masanori Okuyama, Kohzo Ohtani, Toshi-yukiueda, and Yoshihiro Hamakawa. In this sensor, the $PbTiO_3$ thin film is sputtered onto a silicon wafer.

Referring to FIG. 1B, a three dimensional drawing of the method of Okuyama, et al. 1985 is shown. In Okuyama, et al. 1985, the $PbTiO_3$ device is now constructed as an interdigitized sensor built out of silicon cantilevers or silicon bridges. The approach described in the 1985 Okuyama, et al. paper suffers from similar thermal problems of the device in the Okuyama, et al. 1984 paper. Such silicon structures whether solid substrate bridges or cantilevers are also poorly thermally isolated.

Therefore, it is one motivation of this invention to provide a novel $PbTiO_3$ based pyroelectric sensor that is more sensitive to incoming infrared radiation by providing a means of more effective thermal isolation. The invention advantageously utilizes micromachining techniques. Techniques of dynamic micromechanics on silicon have been well-known in the art. A good review of dynamic micromachining techniques can be found in an article by Curt E. Peterson in the *IEEE Transactions on Electronic Devices*, Vol. ED-25, No. 10, October 1978, page 1241–1250. Silicon based dynamic micromechanics has been used for a number of applications including oil film projection systems, light valves, thin metal-coated $SiO_2$ membranes, piezoresistive strain and pressure sensors, deflectable plated-metal cantilever beams, frequency filters, gas chromatography, and hydraulic valves utilizing silicon membranes among others. Micromechanical devices have been constructed of a thin insulated membrane attached to a silicon substrate at one end and suspended over a pit in the silicon. The pit is constructed by silicon etching from under the deposited insulating film using a preferential etching procedure.

SUMMARY OF THE INVENTION

The invention provides an imaging array comprised of a thin film pyroelectric array of one or two dimensions. In one example, an array of silicon oxide or silicon nitride microbridges is prepared with a film of pyroelectric material such as $PbTiO_3$ deposited on the silicon oxide or silicon nitride. Modulated infrared radiation incident upon the $PbTiO_3$ causes the generation of a time dependent electric signal in the pyroelectric material, whose radiant amplitude, which varies from pixel to pixel, and reproduces the radiant power distribution incident upon the array.

It is an object of the invention to provide a pyroelectric array built on a thin layer of PbTiO$_3$ deposited on a silicon oxide or silicon nitride microbridge structure.

It is another object of the invention to provide a pyroelectric array with high responsivity.

It is a further object of the invention to provide an infrared imaging system that does not depend on cryogenic cooling.

It is yet a further object of the invention to provide a pyroelectric imaging array that combines the thermal isolation of a silicon oxide or silicon nitride microbridge with the detection advantages of a pyroelectric material.

It is yet a further object of the invention to provide a pyroelectric array that does not require a bias.

It is yet a further object of the invention to provide a pyroelectric array that reduces self heating due to power losses.

It is a further object of the invention to provide a pyroelectric imaging array that minimizes 1/F power noise where F is frequency.

It is still a further object of the invention to provide a pyroelectric imaging array that has a reduced power requirement useful for battery powered man-portable thermal imaging viewers.

It is yet a further object of the invention to provide a pyroelectric imaging array that does not need background subtraction circuitry.

It is yet a further object of the invention to provide a pyroelectric imaging array where the electrical RC constant can be made compatible with the frame time requirement.

Other objects, features and advantages of the present invention will become apparent to those skilled in the art though the Description of the Preferred Embodiment, Claims, and drawings herein wherein like numerals refer to like elements.

BRIEF DESCRIPTION OF THE DRAWINGS

To illustrate the invention, a preferred embodiment of this invention will be described herein with reference to the accompanying drawings. The preferred embodiment concerns an imaging array composed of a thin film pyroelectric array of one or two dimensions.

FIG. 5A shows a top down view of an adjacent electrode embodiment of the invention.

FIG. 5B shows a side view of the adjacent electrode embodiment of the invention.

DESCRIPTION OF THE PREFERRED EMBODIMENT

Figure 1A:
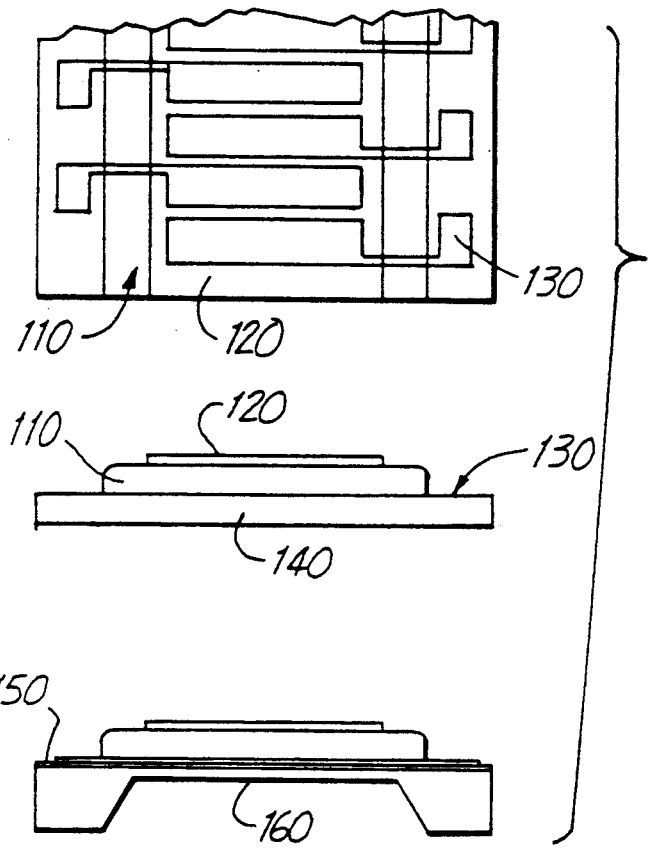
FIG. 1A shows a top and side view of the prior art sensor.
Figure 1B:
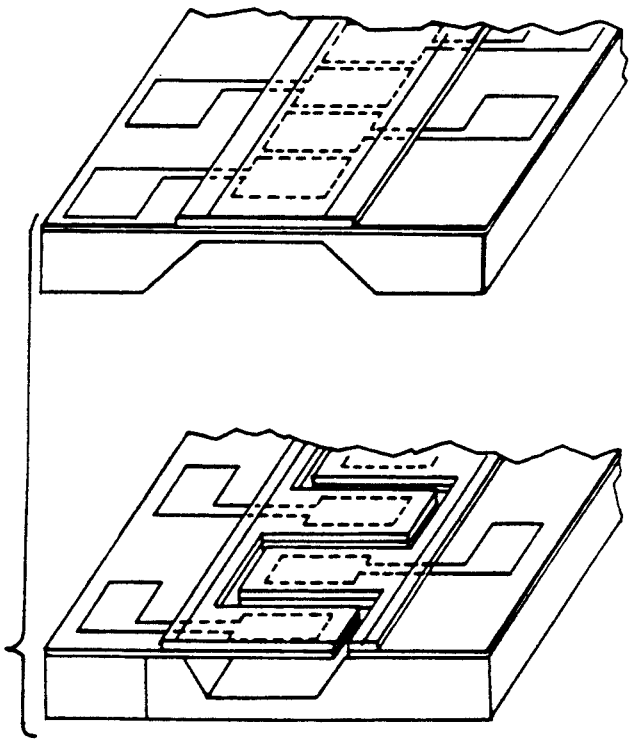
FIG. 1B shows an isometric view of a prior art pyroelectric sensor.
Figure 2:
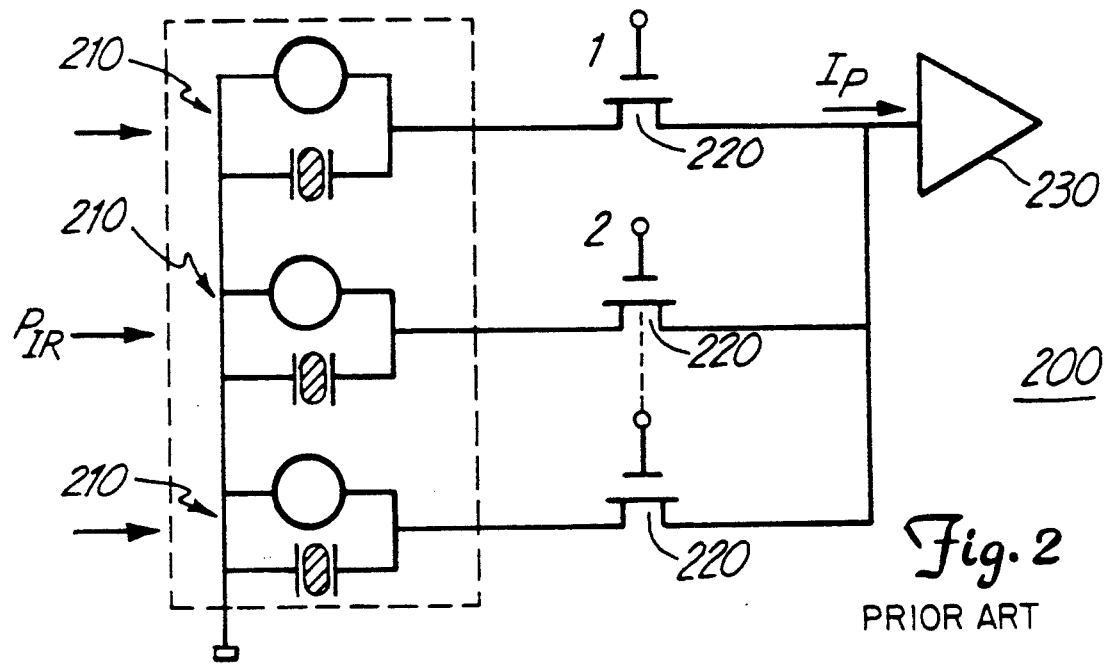
FIG. 2 shows an equivalent circuit of the prior art sensor.
Figure 3:
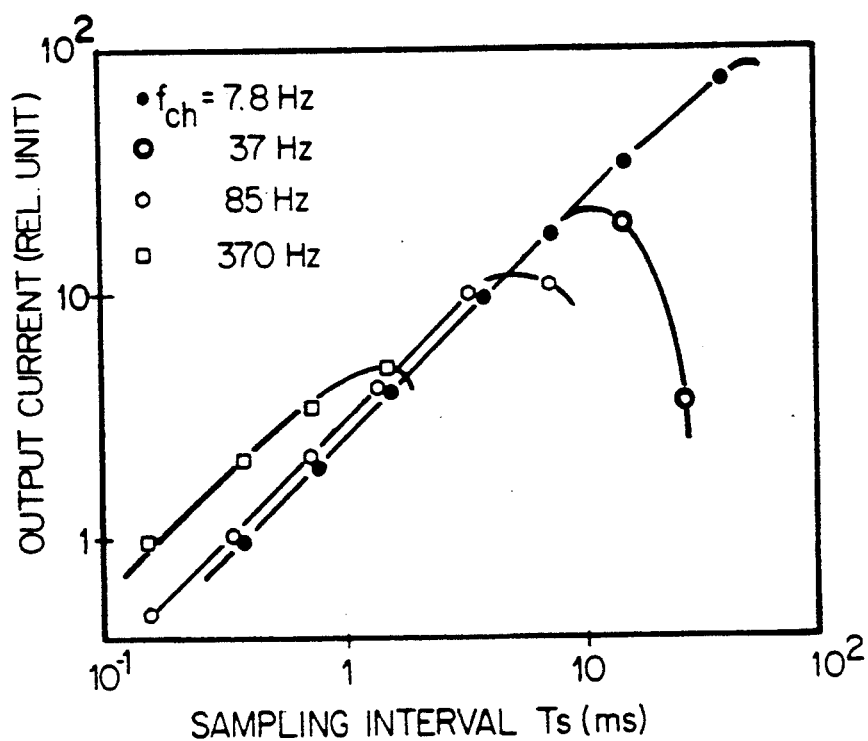
FIG. 3 shows an output current verses sample interval response curve sets of a prior art sensor.

To fully describe the preferred embodiment of the invention the theoretical performance of a pyroelectric detector will be explained. After careful review of the theory and operation of a pyroelectric detector, it will be shown that the invention markedly enhances the responsivity, noise immunity and detectivity of a pyroelectric imaging sensor.

Theoretical Performance of a Pyroelectric Detector Responsivity

The responsivity R of a pyroelectric detector can be described by:

$$R = (\eta \omega p A r/G)(1+\omega^2\tau^2_E)-\frac{1}{2}(1+\omega^2\tau^2_T)-\frac{1}{2}$$

Here $\eta$ is the fraction of incident radiant power absorbed by the sensitive element, $\omega$ is the angular frequency, p is the pyroelectric coefficient, A is the area of the sensitive element, r is the parallel resistance, $r_{eq}$ is the sensitive element resistance, $r_L$ is the resistance of the input to the readout electronics, G is the appropriate thermal conductance, $\tau_E$ is the electrical time constant, and $\tau_T$ is the thermal time constant. The sensitive element is the composite structure of the pyroelectric thin layer on its silicon oxide or silicon nitride microbridge.

The electrical time constant $\tau E$ is given by the product of the parallel resistance and the parallel capacitance of the sensitive element and readout electronics. It will be assumed that the capacitance of the sensitive element $C_{SE}$ determines the overall capacitance. Thus the effective electrical time constant $\tau_E$ is $$\tau_E = rC_{SE} \quad (2)$$

The value of $C_{SE}$ is given by $$C_{SE} = \epsilon'\epsilon_o A/d \quad (3)$$

where $\epsilon'$ is the dielectric constant of the sensitive element, $\epsilon_o$ is the permittivity of free space, and d is the thickness of the sensitive element.

The thermal time constant $\tau_T$ is given by $$\tau_T = H/G \quad (4)$$

where H is the thermal mass (heat capacity) of the sensitive element and G is the thermal conductance between the sensitive element and its surroundings. Thus $$H = c'Ad \quad (5)$$

where $c'$ is the heat capacity per unit volume of the sensitive element.

Noise

Consider now the sources of noise. These include Johnson noise, temperature fluctuation noise, background fluctuation noise, and amplifier noise. Since the detector is operated unbiased, there will be no 1/f noise. It is assumed that 1/f noise from the readout electronics is negligible. The Johnson noise voltage $V_{N,SE}$ in the equivalent resistance $r^{eq}$ is given by $$V_{N,SE} = [4kTr_{eq}B\omega\tau_E \tan\delta(1+\omega^2\tau^2_E)-1]^{\frac{1}{2}} \quad (6)$$

where k is Boltzmann's constant, T is the absolute temperature, B is the electrical bandwidth, and $\tan\delta$ is the loss tangent of the pyroelectric element, defined as $$\tan\delta = (\omega r_{eq}C_{SE})-1 = (\omega\rho_{eq}\epsilon'\epsilon_0)-1 = (\omega\tau_E)-1 \quad (7)$$

where $\rho_{eq}$ is the equivalent resistivity associate with $r_{eq}$.

Thus the Johnson noise in the sensitive element can also be expressed as $$V_{N,SE} = [4kTr_{eq}B(1+\omega^2\tau^2_E)-1]^{\frac{1}{2}} \quad (8)$$

In quadrature with the Johnson noise in the sensitive element is Johnson noise in the input resistance, given by $$V_{N,IR} = (4kTr_L B)^{\frac{1}{2}} \quad (9)$$

In pyroelectric materials there are two contributions to the loss tangent. One is the intrinsic loss resistance of the material. The other is due to "electro-thermal coupling." Prior art works have shown that for pyroelectric materials the thermal and electrical properties are uniquely interrelated. The loss tangent of pyroelectric materials due to electro-thermal coupling is $$\tan\delta = k^2_T \omega\tau_T(1+\omega^2\tau^2_T)-1 \quad (10)$$

where $k_T$, the electro-thermal coupling factor, is given by $$k_T = [p^2T(c'\epsilon a \epsilon_0)-1] \quad (11)$$

The contribution to Johnson noise arising from electro-thermal coupling is thus given by $$V_{N,SE,ET} = \left[ \frac{4kT^2r^2_{eq}p^2\omega^2A^2B}{G(1+\omega^2\tau^2_E)(1+\omega^2\tau^2_T)} \right]^{\frac{1}{2}} \quad (12)$$

or $$V_{N,SE,ET} = \left[ \frac{4kGB(1+\omega^2\tau^2_T)}{\omega^2A^2P^2(1+\omega^2\tau^2_E)} \right]^{\frac{1}{2}} \quad (13)$$

The contribution from electro-thermal coupling manifests itself as temperature fluctuation noise, arising from either conduction to the substrate or radiative interchange. Thus it is not necessary to postulate temperature fluctuation noise as a separate mechanism; in pyroelectric materials it is a manifestation of Johnson noise due to electro-thermal coupling.

Detectivity

The value of the detectivity, represented by D*, is obtained from $$D^* = (AB)^{\frac{1}{2}}R(V_N)-1 \quad (14)$$

Under those conditions in which the intrinsic loss resistance of the sensitive element is the dominant source of Johnson noise, the value of D*, obtained by combining equations (1), (8) and (14) is $$D^* = \frac{\eta pA\omega[Ar_{eq}(kT)^{-1}(1+\omega^2\tau_T^2)^{-1}]^{\frac{1}{2}}}{2G} \quad (15)$$

Under those conditions in which electro-thermal coupling determines the loss, and the Johnson noise associated with it is dominant, the value of D*, obtained by combining equations (1), (12), (14) is $$D^*_{ET} = [\eta^2A(4kT^2G)-1]^{\frac{1}{2}} \quad (16)$$

The value of D* given by equation (16) is the temperature fluctuation noise limit. Under those conditions in which the dominant conduction loss is radiative interchange, the value of G is given by $$G_{RI} = 4A\eta\sigma T^3 \quad (17)$$

where $\sigma$ is the Stephan-Boltzmann constant. In this case $$D^*_{RI} = [\eta(16\sigma kT^5)-1]^{\frac{1}{2}} \quad (18)$$

which is the well-known expression for the background limited D* of thermal detectors. It is set by temperature fluctuation noise arising from radiative interchange between the sensitive element and the background. Its value at room temperature for $\eta=1$ is $1.8\times10^{10}$ cm Hz$^{\frac{1}{2}}$/Watt.

In practice, the Johnson noise associated with the input resistance of the electronics must be included in the total noise. Therefore, the total noise, consisting of contributions from electro-thermal coupling, the intrinsic loss resistance, and the input resistance is given by $$V_N = \left[ \frac{4kTr_{eq}B}{(1+\omega^2\tau_E^2)} + \frac{4kGB(1+\omega^2\tau_T^2)}{\omega^2A^2P^2(1+\omega^2\tau_E^2)} + 4kTr_L B \right]^{\frac{1}{2}} \quad (19)$$

In this case, D* is determined from equations (1), (14), and (19).

Properties of PbTiO₃

PbTiO$_3$ has been investigated for use as a pyroelectric material both in bulk crystal and thin film forms. Representative values for a 2 um thick sputtered film are as follows:

TABLE 1

Properties of PbTiO$_3$

| | | |
|---|---|---|
| p | 6 × 10$^{-8}$ | Coul/cm$^2$ deg K. |
| $\epsilon_{PT}'$ | 200 | |
| $C_{PT}'$ | 3.2 | Joules/cm$^3$ deg K. |
| $T_C$ | 470 | deg C. |

Here $T_C$ Curie temperature.

Other pyroelectric materials are suitable for use in the apparatus of the invention, examples include lithium niobate (LiNbO$_3$), lithium tantalate (LiTaO$_3$), barium titanate (BaTiO$_3$), triglycine sulfate (TGS), zinc oxide (ZnO) and lead zirconium titanate (PZT).

Figure 4:
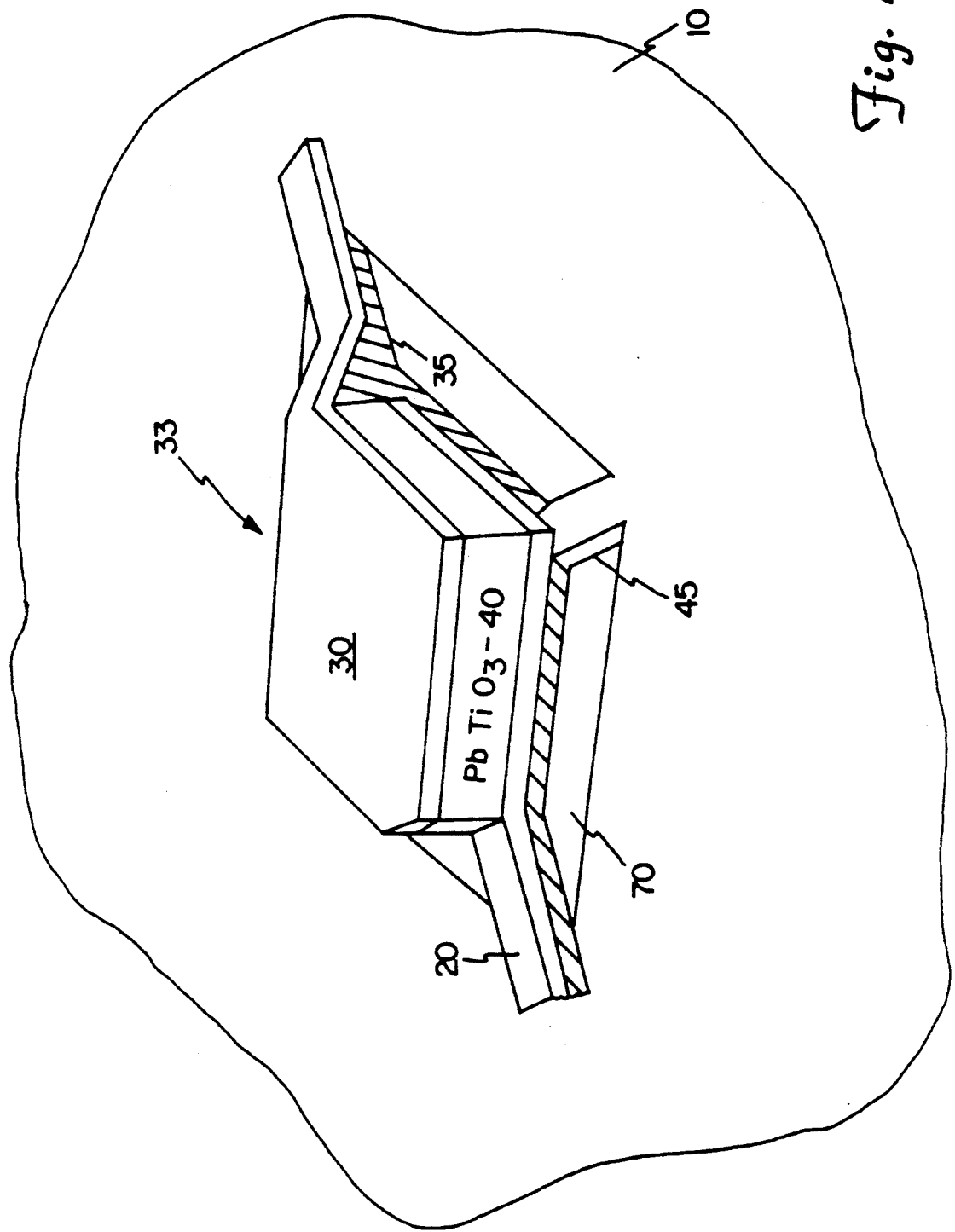
FIG. 4A shows a top down view of one embodiment of the invention.
FIG. 4B shows a side view of the overlapping electrode of one embodiment of the invention.
FIG. 4C shows an isometric view of one example of the invention using overlapping electrodes.

Referring now to FIG. 4A, a schematic view of the sensor of the invention is shown from the one side of a silicon wafer. The invention is fabricated from a wafer of single crystal silicon upon which various processes deposit functional elements. Special features, such as thermal isolation cavities are formed by preferential etching or equivalent processes. FIG. 4A shows the top view of a pyroelectric pixel indicating the configuration of the current carrying legs 20 and 30. FIG. 4A shows the silicon substrate 10 which surrounds the pyroelectric pixel and also provides the supporting material for the pixel itself.

Figure 4B:
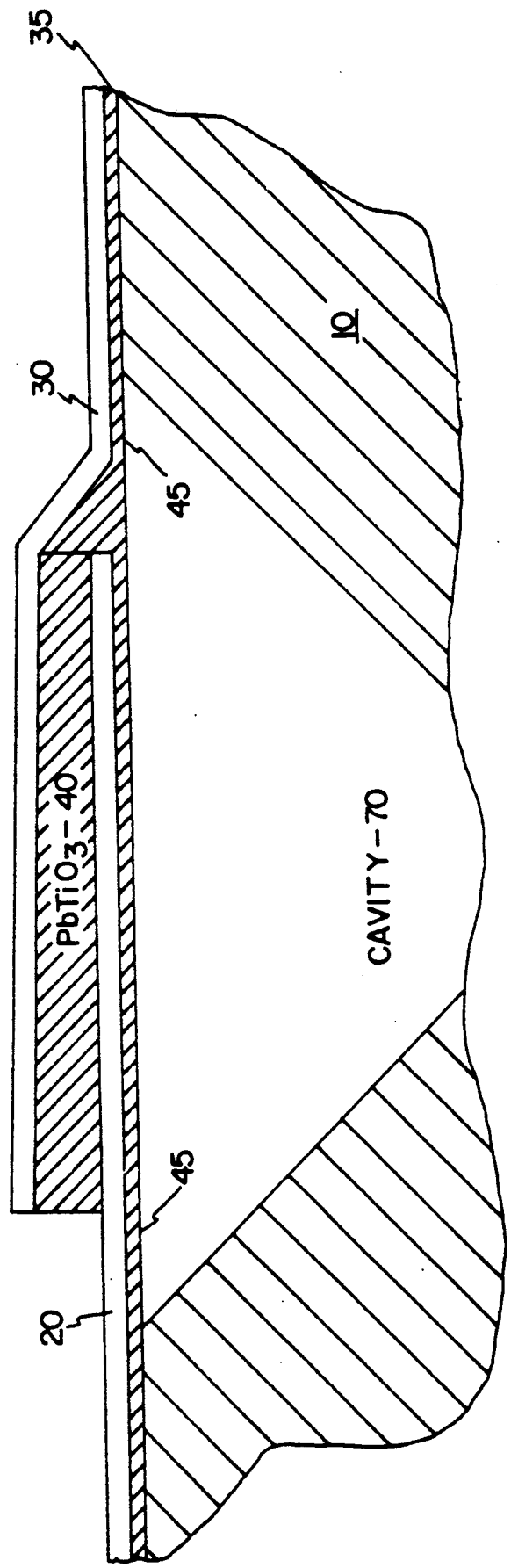

A cross section of FIG. 4A is shown by FIG. 4B. The silicon substrate 10 is etched away under a silicon oxide or silicon nitride to form a microbridge 45 on which the pyroelectric material has been previously deposited. The radiation sensing pixel is formed from a sandwich of conducting material and PbTiO$_3$ supported by the structural, nonconducting legs of the microbridge 45. The conducting material of the current carrying legs 30 and 20 is isolated from the silicon substrate by a layer of silicon dioxide or silicon nitride, SiO$_2$, or silicon nitride, Si$_3$N$_4$. The current carrying leg 30 forms one plate of the capacitor and can be seen in FIG. 4A as the large diamond in the center. The conducting material of the opposite current carrying leg 20 forms the other plate of the capacitor, part of which is shown on the left side and part of which is obscured by the diamond in the center. The cavity 70 beneath the pyroelectric pixel physically isolates the pixel from the silicon substrate.

FIG. 4C shows an isometric view of one example of the pyroelectric pixel 33 of the invention. The opposing electrode configuration of the invention is illustrated wherein the PbTiO$_3$ is sandwiched between the Pt electrode pair. The thermally isolated microbridge can be seen suspended over cavity 70. Current carrying legs 20 and 30 can be clearly viewed as forming a capacitive structure with the PbTiO$_3$ 40. The support legs 45 are providing mechanical support as well as affording good thermal isolation from the silicon substrate 10. Absorbed infrared radiation is sensed by the PbTiO$_3$, the voltage difference across the leads 30 and 20 being proportional to the amount of absorbed radiation.

Referring now to FIG. 5A, the schematic view of the sensor is shown from one side of a silicon substrate. FIG. 5A shows an alternative top view of the pyroelectric pixel indicating the configuration of the current carrying legs 20 and 30. FIG. 5A differs from FIG. 4A in that the current carrying electrode 30 is no longer electrically connected to the first plate of the capacitor numbered at 25 in FIG. 5A.

FIG. 5B shows a cross section of a pyroelectric detector forming an alternate embodiment pyroelectric pixel. The PbTiO$_3$ 40 is suspended by a silicon dioxide or silicon nitride microbridge over cavity 70. The PbTiO$_3$ sensing element is sandwiched between the current carrying legs 20 and 30 and the free plate 25. The free plate 25, along with the adjacent electrodes 20 and 30, enable a more easily fabricated structure. The embodiment of the invention also provides an effective means of thermally isolating the PbTiO$_3$ sensing element from the silicon substrate.

The current legs, 20 and 30, are comprised of a first conductive thin film electrode deposited on one of the legs covering substantially half of the microbridge and a second conductive thin film electrode deposited on the opposing leg and covering the remaining portion of the microbridge with a gap 45a separating the first and second electrodes.

Figure 5C:
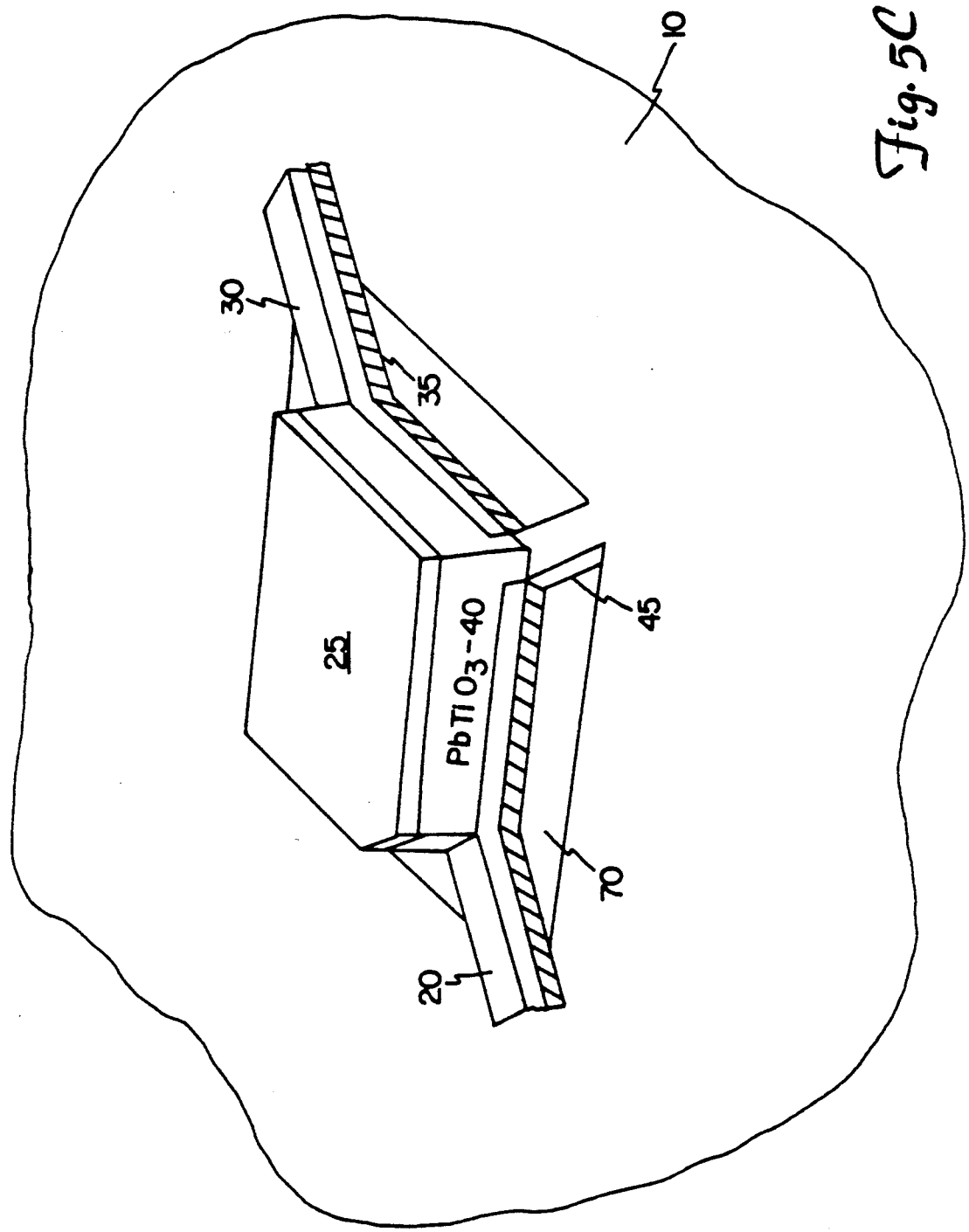
FIG. 5C shows an isometric view of the adjacent electrode embodiment of the invention.

FIG. 5C shows an isometric view of the pyroelectric imaging sensor of this alternate embodiment of the invention. The isolated sensor can be seen suspended over cavity 70. Current carrying legs 20 and 30 can be clearly seen, as in the alternate embodiment, as forming a sandwich with the PbTiO$_3$ 40 and an isolated conducting layer forming an alternate capacitor plate 25. The supporting legs 45 are providing mechanical support as well as providing good thermal isolation by separating the PbTiO$_3$ sensor from the silicon substrate. Absorbed radiation is sensed by the PbTiO$_3$ by a voltage difference across leads 30 and 20 proportional to incident radiation.

Figure 6:
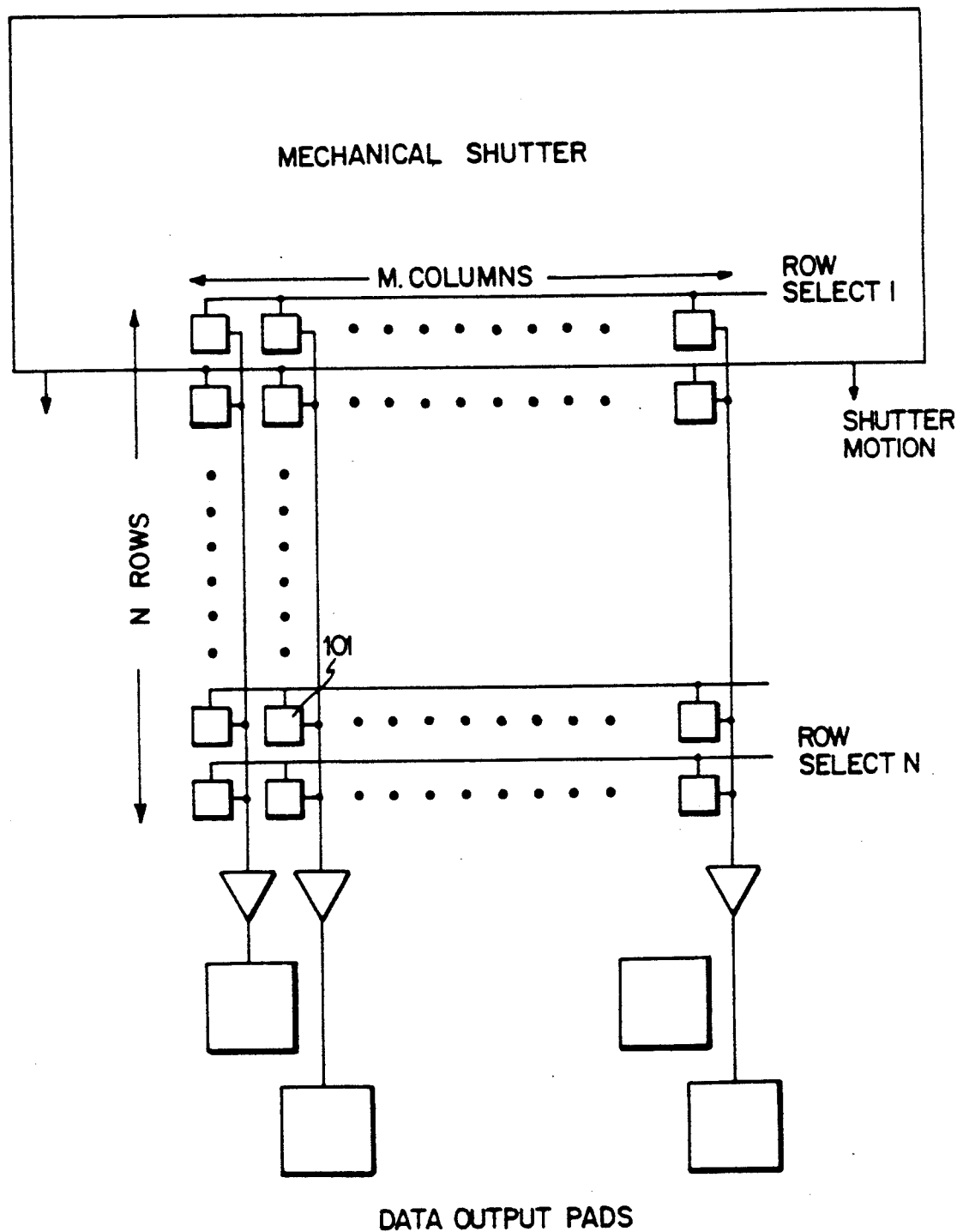
FIG. 6 shows schematically a pyroelectric imaging array architecture employed in one example of the invention.

Now referring to FIG. 6 which shows the arrangement of rows and columns of the PbTiO$_3$ readout electronics. Each pixel 701 is represented by a square. The array is arranged in an M by N row and column fashion. A mechanical shutter 704 move in the direction of motion indicated by arrow 706. The mechanical shutter 704 selectively shades each of the N rows of M columns as it progresses along the array. Thus pixels 701 are prevented from sensing incident radiation when covered by the shutter 704. The data output pads 708 are used to send information from the array to the system using the array. Row select line 710 selects one of the N rows.

Figure 7:
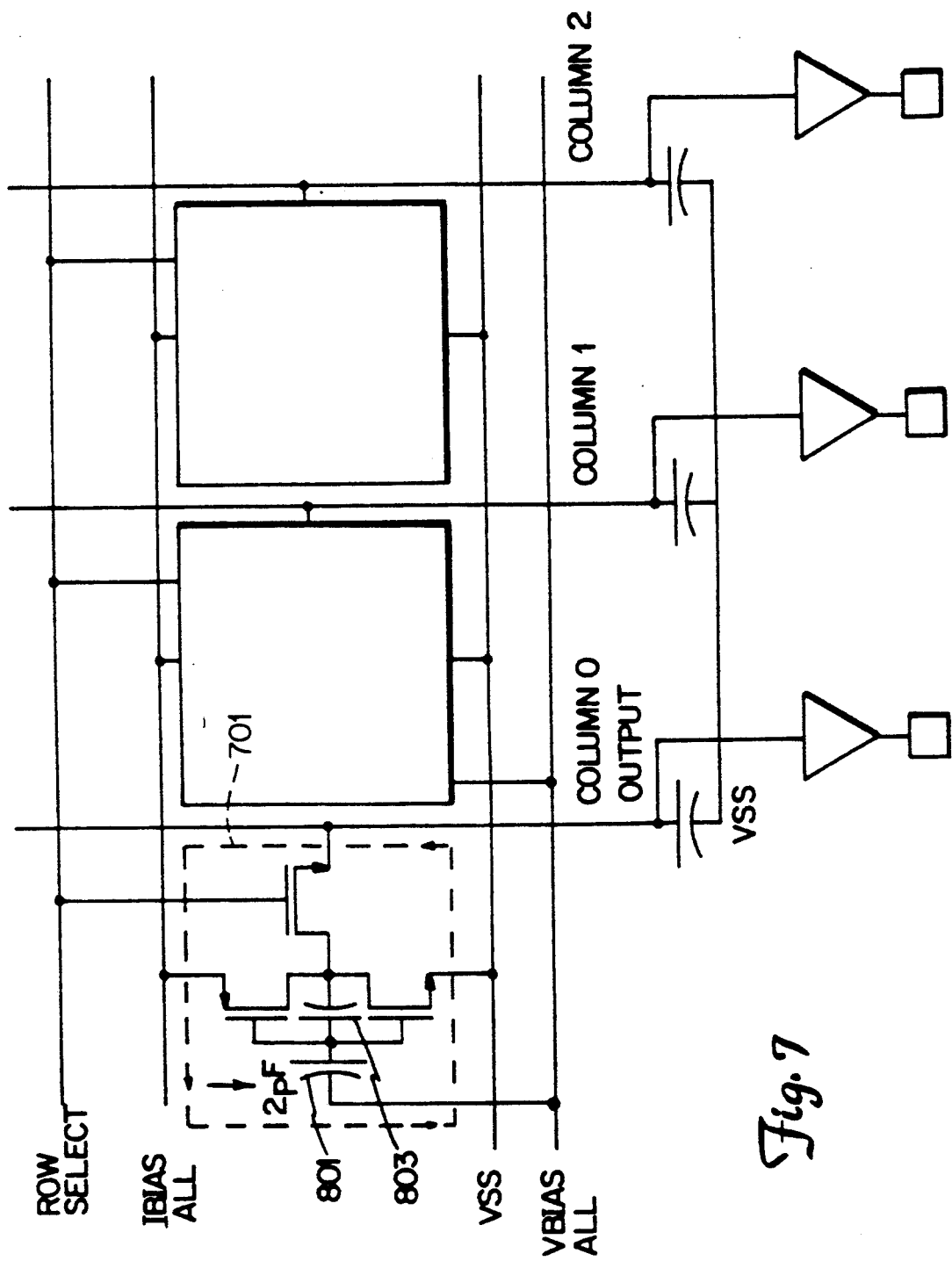
FIG. 7 shows a more detailed schematic of a single pixel used in the architecture of FIG. 6.

Now referring to FIG. 7 which shows the details within each pixel 701, enclosed by the dotted line. The PbTiO$_3$ pyroelectric detector is represented by the 2pF capacitor 801. The remaining devices are deposited or constructed either underneath or alongside in the silicon 10. This includes 3 FET's 805, 807, 809 and a 0.1 pF capacitor. The 0.1pf capacitor 803 can also be made of PbTiO$_3$ in which case it is shielded from any incident thermal radiation. In use each pixel 701 is scanned sequentially from left to right in a selected row. Then from left to right in the adjacent row immediately below and so on. The shutter is synchronized to the vertical scanning speed.

In one example embodiment of the invention the FET's of the apparatus of the invention are 25 microns wide and 50 microns long. Those skilled in the art will recognize that it is desirable to have the electronics beneath the microbridge structure in which case the use of a "sacrificial layer" is required in processing the array. In an alternative embodiment of the invention, the electronics can be in the silicon substrate alongside the microbridge. If the electronics are constructed alongside the microbridge the area of each pixel is then approximately doubled, however the sensitive part on the microbridge remains the same.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A radiation sensor comprising:
   (a) a substrate having opposing flat surfaces wherein one surface has a cavity;
   (b) a microbridge suspended over the cavity comprised of a material selected from the group consisting of silicon oxide and silicon nitride, wherein the microbridge includes a plurality of support legs;
   (c) a first conductive thin film electrode deposited on one of the legs covering substantially half the surface of the microbridge;

(d) a second conductive thin film electrode deposited on the opposing leg and substantially covering the remaining portion of the microbridge in such a manner as to allow a gap to exist between the first and second electrodes;

(e) a thin film of pyroelectric material deposited on, and substantially covering, the surface of the first and second electrodes; and (f) a thin film conductor deposited on the surface of the pyroelectric material.

2. The radiation sensor of claim 1 wherein the first and second electrodes comprise a material from the group consisting of platinum, aluminum and gold.

3. The radiation sensor of claim 1 wherein the substrate comprises a single crystal wafer comprised of a material from the group consisting of silicon and gallium arsenide.

4. The radiation sensor of claim 1 wherein the microbridge is thermally isolated.

5. The radiation sensor of claim 1 wherein the pyroelectric material comprises a material from the group consisting of PbTiO$_3$, LiNbO$_3$, LiTaO$_3$, BaTiO$_3$, TGS, ZnO and PZT.

6. A radiation sensor having a plurality of radiation sensing pixels arranged in an array of pixels having an individual row and column address for each pixel and connected to be read out by said individual address, wherein the radiation sensing pixel comprises:

(a) a substrate having opposing flat surfaces wherein one surface has a cavity;

(b) a microbridge suspended over the cavity comprised of a material selected from the group consisting of silicon oxide and silicon nitride, wherein the microbridge includes a plurality of support legs;

(c) a first conductive thin film electrode deposited on one of the legs covering substantially half the surface of the microbridge;

(d) a second conductive thin film electrode deposited on the opposing leg and substantially covering the remaining portion of the microbridge in such a manner as to allow a gap to exist between the first and second electrodes;

(e) a thin film of pyroelectric material deposited on, and substantially covering, the surface of the first and second electrodes; and (f) a thin film conductor deposited on the surface of the pyroelectric material.

7. The radiation sensor of claim 6 wherein the pyroelectric material comprises a material from the group consisting of PbTiO$_3$, LiNbO$_3$, LiTaO$_3$, BaTiO$_3$, TGS, ZnO and PZT.

8. The radiation sensor of claim 6 further including a moveable shutter means and readout electronics means wherein each pixel further comprises a means for scanning, and wherein the means for scanning scans from a first pixel to a last pixel in a selected row and the shutter means is synchronized to the scanning of each selected row.

9. The radiation sensor of claim 8 wherein the means for scanning further comprises a self closing switch.

10. A radiation sensor comprising:

(a) a substrate having opposing flat surfaces wherein one surface has a cavity;

(b) a microbridge suspended over the cavity comprised of a material selected from the group consisting of silicon oxide and silicon nitride, wherein the microbridge includes a plurality of support legs;

(c) a first conductive thin film electrode deposited on one of the legs covering substantially half the surface of the microbridge;

(d) a second conductive thin film electrode deposited on the opposing leg and substantially covering the remaining portion of the microbridge in such a manner as to allow a gap to exist between the first and second electrodes;

(e) a thin film of pyroelectric material deposited on, and substantially covering, the surface of the first and second electrodes; and (f) a thin film conductor deposited on the surface of the pyroelectric material, and wherein the step of forming the cavity is accomplished by preferential etching.

11. A device as set forth in claim 10 having electronics associated with each pixel sensor located in a layer beneath said sensor.

* * * * *